United States Patent [19]

Hung

[11] Patent Number: 5,387,459
[45] Date of Patent: Feb. 7, 1995

[54] MULTILAYER STRUCTURE HAVING AN EPITAXIAL METAL ELECTRODE

[75] Inventor: Liang-Sun Hung, Webster, N.Y.

[73] Assignee: Eastman Kodak Company, Rochester, N.Y.

[21] Appl. No.: 992,214

[22] Filed: Dec. 17, 1992

[51] Int. Cl.$^6$ .............. B32B 3/00; H01B 3/12
[52] U.S. Cl. .................... 428/209; 428/446; 428/472; 428/697; 428/698; 428/699; 428/701; 428/702; 428/704
[58] Field of Search ............. 428/209, 446, 472, 469, 428/697, 699, 704, 701, 702, 698

[56] References Cited

U.S. PATENT DOCUMENTS 4,260,663 4/1981 Hagemann et al. ............... 428/472
4,490,429 12/1984 Tosaki et al. ..................... 428/210

OTHER PUBLICATIONS

Takayama, R. et al., Journal of Applied Physics, vol. 65, (1989), pp. 1666–1670.
Matsubara, S. et al., Journal of Applied Physics, vol. 66, (1989) pp. 5826–5832.
Sinharoy, S., Thin Solid Films, vol. 187, (1990), pp. 231–243.
Tiwari, A. N. et al., Journal Applied Physics, vol. 71, (1992), pp. 5095–5098.
Hung, L. S., et al., Applied Physics Letters, vol. 60, (13 Jan. 1992), pp. 201–203.
Inoue, T., Applied Physics Letters, vol. 59, (1991), pp. 3604–3606.
Osaka, Y., et al., Journal of Applied Physics, vol. 63, (1988), pp. 581–582.
Fork, D. K. et al., Applied Physics Letters, vol. 60, (1992), pp. 1621–1623.
Hung, L. S., et al., Applied Physics Letters, vol. 60, (1992), pp. 3129–3131.
Niwa, H., et al., Applied Physics Letters, vol. 60, (1992), pp. 2520–2521.
Thangaraj, N. et al., Applied Physics Letters, vol. 61, (1992), pp. 37–39.
Trolier, R., et al., Journal of Crystal Growth, vol. 98 (1989), pp. 469–479.
Peercy, P. S., (chair), et al., "Fundamental issues in heteroepitaxy—A Department of Energy Council on Materials Science Panel Report", Journal of Materials Research, vol. 5 (Apr. 1990), p. 853 (at 854).
Ryoichi Takayata and Yoshihiro Tomita, J. Appl. Phys. 65, 1666 (1989).
Shogo Matsubara, Sadahiko Miura, Yoichi Miyasaka, and Nobuaki Shohata, J. Appl. Phys. 66, 5826 (1989).

Primary Examiner—A. A. Turner
Attorney, Agent, or Firm—Raymond L. Owens

[57] ABSTRACT

A multilayer structure comprising in order: an oriented single crystal substrate, an epitaxial buffer layer, an epitaxial metal electrode, and an epitaxial metal oxide upper layer deposited on the metal electrode. The substrate is a semiconductor selected from the group consisting of Si compounds, Ge compounds, and compounds having at least one element selected from the group consisting of Al, Ga, and In and at least one element selected from the group consisting of N, P, As, and Sb.

31 Claims, 5 Drawing Sheets

MULTILAYER STRUCTURE HAVING AN EPITAXIAL METAL ELECTRODE

FIELD OF THE INVENTION

This invention relates to multilayer structures, including a semiconductor substrate, which are suitable for use in electronic, optical or electro-optic applications. This invention more particularly relates to a multilayer structure having an epitaxial metal electrode.

BACKGROUND OF THE INVENTION

It is known that oxide films with oriented crystallites generally exhibit improved properties. For example, Takayama, R. et al, Journal of Applied Physics, Vol. 65, (1989), pp 1666–1670, teaches the preparation of c-axis oriented lead zirconate titanate (PZT) thin films on (100)MgO substrates by rf-magnetron sputtering, which have relatively high pyroelectric coefficients.

The growth of oriented oxide films on semiconductor substrates is very attractive, but it is difficult to achieve in many cases due to film-substrate reaction and substrate oxidation during processing. This problem can be solved by the use of an intermediate layer between the substrate and the oxide film. Matsubara, S. et al, Journal or Applied Physics, Vol. 66, (1989), pp 5826–5832, teaches c-axis oriented PZT films on (100)Si having an epitaxial intermediate layer of $MgAl_2O_4$ prepared by chemical vapor deposition (CVD).

Sinharoy, S., Thin Solid Films, Vol. 187, (1990), pp 231–243 teaches the use of one or more epitaxial alkaline earth fluoride buffer layers on semiconductors including GaAs to provide lattice matching. Tiwari, A. N. et al, Journal of Applied Physics, Vol. 71, (1992), pp. 5095–5098, teaches the use of epitaxial fluoride layers as a buffer for the growth of high-temperature superconducting oxides. Hung, L. S. et al, Applied Physics Letters, Vol. 60, (Jan. 13, 1992), pp. 201–203 teaches that with Si and GaAs substrates, $BaF_2$ and $Ca_xSr_{1-x}F_2$ buffer layers have the advantages of process compatibility with both Si and GaAs, good film quality and low processing temperatures. Epitaxial alkaline earth fluoride buffer layers have the shortcoming of high reactivity with some oxides and deteriorated crystal qualities in oxygen.

Metal oxides such as $ZrO_2$, $PrO_2$, $CeO_2$, $Al_2O_3$, $MgAl_2O_4$ and MgO have been reported to grow epitaxially on Si substrates. $MgAl_2O_4$ has too high a deposition temperature for use with GaAs. Orientation of epitaxial metal oxide buffer layers matches the orientation of the substrate in some cases, but not in others. Inoue, T., Applied Physics Letters, Vol. 59, (1991), pp 3604–3606, teaches epitaxial growth of (111)$CeO_2$ on (111)Si; but epitaxial growth of (110) $CeO_2$ films on (100)Si. Osaka, Y. et al, Journal of Applied Physics, Vol. 63, (1988), pp 581–582; teaches epitaxial growth of (100)$ZrO_2$ on (100)Si, but the growth of polycrystalline films on (111)Si, by the same technique. Fork, D. K. et al, Applied Physics Letters, Vol. 60, (1992), pp 1621–1623 teaches epitaxial growth of a (100) MgO buffer layer on (100) GaAs by using pulsed laser ablation of Mg metal in an oxygen ambient. Hung, L. S. et al, Applied Physics Letters, Vol. 60, (1992), pp 3129–3131, teaches epitaxial growth of a (110)MgO buffer layer on (100)GaAs using ultrahigh vacuum electron beam evaporation of MgO.

In some uses, it is also desirable to have an electrode between an oxide film and its substrate. To prepare an oxide film on Si having a desired orientation and an underlying electrode, it is highly desirable to have an epitaxial metal layer with good adhesion to the substrate and high resistance to oxidation. There are significant obstacles for growth of such epitaxial metal layers because of pronounced differences between semiconductors and metals in crystal structures and lattice parameters, and the relatively high reactivities of metals. Niwa, H. et al, Applied Physics Letters, Vol. 60, (1992), pp 2520–2521; teaches the epitaxial growth of (111)Al on (111)Si. Thangaraj, N. et al, Applied Physics Letters, Vol. 61, (1992), pp 37–39 teaches that the growth of (100)Al on (100)Si is difficult to achieve and the film on (100)Si is (110) oriented. Al has the shortcomings of being highly reactive to oxygen and forming a eutectic liquid with Si at 573° C. Al is thus precluded from use as an underlying electrode for oriented perovskite-type oxides. Pt has a high stability in oxygen at elevated temperatures, but reacts with Si to form $Pt_2Si$ at temperatures as low as 200° C. This shortcoming can be avoided by depositing Pt on a $SiO_2$ layer thermally grown on Si, however, the deposited Pt is polycrystalline and is subject to adhesion problems. Trolier, R. et al, Journal of Crystal Growth, Vol. 98, (1989), pp 469–479 teaches the growth of [100]-oriented Pt on (100) Si using graphoepitaxy, however, this process requires prolonged annealing at elevated temperatures for crystal alignment and produces Pt films which exhibit poor crystal quality and deteriorated surface morphology.

It is therefore highly desirable to prepare structures having an epitaxial metal film, an intermediate layer, and a semiconductor substrate, in which the metal layer has good adhesion and high resistance to oxidation.

SUMMARY OF INVENTION

In the broader aspects of this invention there is provided a multilayer structure comprising in order: an oriented single crystal substrate, an epitaxial buffer layer, an epitaxial metal electrode, and an epitaxial metal oxide upper layer deposited on the metal electrode. The substrate is a semiconductor selected from the group consisting of Si compounds, Ge compounds, and compounds having at least one element selected from the group consisting of Al, Ga, and In and at least one element selected from the group consisting of N, P, As, and Sb.

It is an advantageous feature of at least one embodiment of the invention that the multilayer structure provided has an epitaxial metal film and a semiconductor substrate, in which the metal layer has good adhesion and high resistance to oxidation.

BRIEF DESCRIPTION OF THE FIGURES

The above mentioned and other features and objects of this invention and the manner of attaining them will become more apparent and the invention itself will be better understood by reference to the following description of an embodiment of the invention taken in conjunction with the accompanying drawings wherein.

DESCRIPTION OF PARTICULAR EMBODIMENTS

Figure 1:
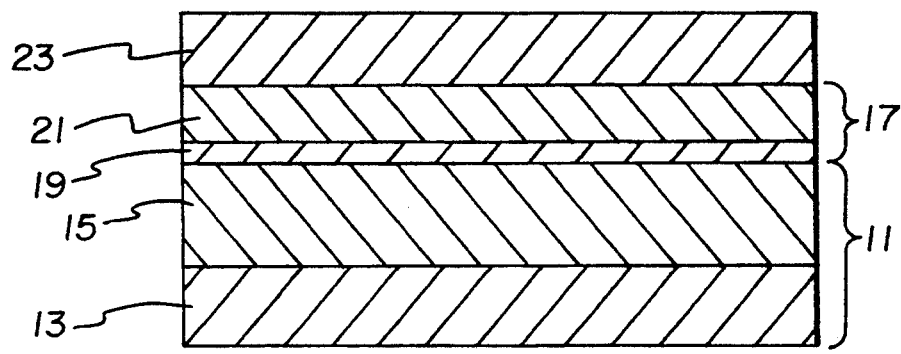
FIG. 1. A schematic diagram of an embodiment of the multilayer structure of the invention.

The multilayer structure 10 of the invention has a base 11, which includes a single crystal substrate 13 and an epitaxial buffer layer 15 deposited on substrate 13. Deposited on buffer layer 15 is an epitaxial metal electrode 17. In a particular embodiment of the invention, electrode 17 has an epitaxial first electrode layer 19 and an epitaxial second electrode layer 21. Multilayer structure 10 can include an epitaxial upper layer 23 deposited on electrode 17.

Substrate 13 is selected from Group IVa (Si,Ge) compounds or Group IIIa-Group Va ((Al,Ga, In)—(N,-P,As,Sb)) compounds. Particularly desirable materials for substrate 13 are single crystal Si and GaAs. Other suitable semiconductors include Si, Ge, GaP, InAs, GaSb, InSb, InP, Si$_x$Ge$_{1-x}$, and Al$_x$Ga$_{1-x}$As, where x is from 0 to 1. These semiconductors support epitaxy and exhibit strong similarity in criteria important to epitaxy: crystal structure and lattice mismatch. Substrate 13 can be either in the (100) or (111) orientation depending upon the desired orientation of buffer layer 15 and metal electrode 17 and the availability of a suitably oriented substrate. Semiconductor crystal structures, (100) sublattice constants and mismatches to (100) oriented GaAs are presented in Table 1. Mismatches for (111) oriented semiconductors are comparable and can be calculated from the (111) sublattice constants listed in Table 2.

TABLE 1

| Semi-conductor | Structure | (100) Sublattice constant in Angstroms | Mismatch to (100) GaAs in percent |
|---|---|---|---|
| GaAs | ZnS (Zinc blende) | 5.653 | — |
| GaP | ZnS (Zinc blende) | 5.450 | −3.59 |
| AlAs | ZnS (Zinc blende) | 5.656 | 0.05 |
| Al$_x$Ga$_{1-x}$As | ZnS (Zinc blende) | 5.653 to 5.656 | 0 to 0.05 |
| InP | ZnS (Zinc blende) | 5.869 | 3.82 |
| InAs | ZnS (Zinc blende) | 6.058 | 7.16 |
| GaSb | ZnS (Zinc blende) | 6.096 | 7.84 |
| Si | ZnS (Diamond) | 5.431 | −3.93 |
| Ge | ZnS (Diamond) | 5.658 | 0.08 |

TABLE 2

| Semiconductor | (111) Sublattice constant (in Angstroms) |
|---|---|
| GaP | 3.854 |
| GaAs | 3.997 |
| AlAs | 3.999 |
| Al$_x$Ga$_{1-x}$As | 3.999 to 3.997 |
| InP | 4.150 |
| InAs | 4.284 |
| GaSb | 4.310 |
| Si | 3.840 |

TABLE 2-continued

| Semiconductor | (111) Sublattice constant (in Angstroms) |
|---|---|
| Ge | 4.001 |

Each of the semiconductors listed in Table 1 has an equivalent crystal structure to GaAs in terms of epitaxy, ZnS(zinc blende or diamond), and a small lattice constant mismatch to GaAs of less than 8 percent. Peercy, P. S., (chair), et al, "Fundamental issues in heteroepitaxy—A Department of Energy, Council on Materials Science Panel Report", Journal of Materials Research, Vol. 5, (April, 1990), p. 853 (at 854); notes that it is a long held precept of epitaxy that for two materials of the same crystal structure and orientation, "epitaxial growth requires a misfit ε (ε=|b−a|/a where a and b are the in-plane lattice constants of substrate and overgrowth) of not more than about 15%)"; or stated more generally: "an epitaxial relationship is probable whenever the orientation of the substrate and overgrowth produces an interface with a highly coincident atomic structure having low interfacial energy relative to a random arrangement." The same principles apply to a comparison of two materials support of epitaxial growth of an overlayer of a third material.

Substrate 13 can be an undoped, lightly doped or heavily doped semiconductor. Suitable dopants include, for a Group IVa compound: As, P, B, Sb, and Bi and for a Group IIIa-Group Va compound: Si, Ge, Zn, and Mg. Substrate 13 may be doped everywhere or only in selected areas on the substrate surface.

In some applications, a part of the semiconductor can be used as substrate 13 for the multilayer structure of the invention 10, while the remaining part of the semiconductor wafer can be processed to form a variety of electronic devices, such as field-effect transistors.

Epitaxially grown buffer layer 15 overlays substrate 13. Buffer 15 acts as a diffusion barrier and a seed for the growth of epitaxial electrode 17 and has a thickness which is sufficient to impede interactions between substrate and layers 17 and 23. Buffer layer 15 can be provided by conventional deposition techniques, such as laser ablation, electron beam evaporation, or chemical vapor deposition (CVD). In a particular embodiment of the invention, an exemplary buffer layer 15 has a thickness from 30 to 500 nm or, more desirably from 100 to 300 nm.

Buffer layer 15 can be a metal oxide or an alkaline earth metal fluoride. Suitable alkaline earth metal fluorides include: BaF$_2$ and Ca$_x$Sr$_{1-x}$F$_2$, where x is from 0 to 1. Suitable metal oxides include: CeO$_2$, ZrO$_2$, MgO, and SrTiO$_3$.

BaF$_2$ and Ca$_x$Sr$_{1-x}$F$_2$ compounds, such as CaF$_2$ and SrF$_2$, have a fluorite crystal structure similar, for epitaxy purposes, with a zinc blende or diamond structure semiconductor substrate 11. Sublattice mismatches of (100) orientation fluorides to semiconductors are listed in Table 3. Mismatches are calculated for a 1 to 1 sublattice match, that is, the unit cells of the semiconductor and buffer layer material have dimensions equal to one times the respective sublattice constants.

TABLE 3

| Buffer (100) | Mismatch of buffer to semi-conductor (1:1) (in percent) | | |
|---|---|---|---|
| | CaF$_2$ | SrF$_2$ | BaF$_2$ |
| Semi-conductor (100) | Sublattice constants | 5.463Å | 5.800Å | 6.200Å |
| GaP | 5.450Å | +0.23 | +6.42 | +14.68 |
| GaAs | 5.653Å | −3.36 | +2.60 | +9.68 |
| AlAs | 5.656Å | −3.41 | +2.55 | +9.62 |
| Al$_x$Ga$_{1-x}$As | | +3.36 to 3.41 | +2.60 to 2.55 | +9.68 to 9.62 |
| InP | 5.869Å | −6.92 | −1.18 | +5.64 |
| InAs | 6.058Å | −9.82 | −4.26 | +2.34 |
| GaSb | 6.096Å | −10.38 | −4.86 | +1.71 |
| Si | 5.431Å | +0.59 | +6.79 | +14.16 |
| Ge | 5.659Å | −3.46 | +2.49 | +9.56 |

All mismatches are within 15 percent, however, it is generally desirable to select materials so as to reduce mismatch. Sublattice mismatches (1:1) for (111) orientation fluorides and semiconductors are similar to those for the (100) orientation and can be calculated from the sublattice constants presented in Tables 2 and 4. With Si and GaAs substrates, BaF$_2$ and Ca$_x$Sr$_{1-x}$F$_2$ buffer layers 15 have the advantages of process compatibility with both Si and GaAs, good film quality and low processing temperatures.

TABLE 4

| Material | (111) Sublattice constant (in Angstroms) |
|---|---|
| CaF$_2$ | 3.863 |
| Ca$_x$Sr$_{1-x}$F$_2$ | 3.863–4.101 |
| SrF$_2$ | 4.101 |
| BaF$_2$ | 4.384 |
| ZrO$_2$ | 3.762 |
| CeO$_2$ | 3.825 |
| MgO | 2.977 |
| SrTiO$_3$ | 2.761 |

CeO$_2$ and ZrO$_2$ buffer layers 15 also have a fluorite crystal structure and small mismatches to the semiconductor of substrate 11. Sublattice constants and mismatches for (100) CeO$_2$ and ZrO$_2$ appear in Table 5. Sublattice constants for (111) CeO$_2$ and ZrO$_2$ appear in Table 4.

TABLE 5

| Buffer layer | | Mismatch of buffer layer to semiconductor | | | |
|---|---|---|---|---|---|
| | | ZrO$_2$ | CeO$_2$ | MgO | SrTiO$_3$ |
| | Super-lattice ratio | 1:1 | 1:1 | 4:3 | 4:3 |
| Semi-conductor | (100) Sub-lattice constants | 5.320Å | 5.409Å | 4.211Å | 3.904Å |
| GaP | 5.450Å | −2.39 | −0.75 | +3.02 | −4.49 |
| GaAs | 5.653Å | −5.89 | −4.32 | −0.68 | −7.92 |
| AlAs | 5.656Å | −5.94 | −4.37 | −0.73 | −7.97 |
| Al$_x$Ga$_{1-x}$As | | −5.89 to −5.94 | −4.32 to −4.37 | −0.68 to −0.73 | −7.92 to −7.97 |
| InP | 5.869Å | −9.35 | −7.84 | −4.33 | −11.31 |
| InAs | 6.058Å | −12.18 | −10.71 | −7.32 | −14.08 |
| GaSb | 6.096Å | −12.73 | −11.27 | −7.90 | −14.61 |
| Si | 5.431Å | −2.04 | −0.41 | +3.38 | −4.15 |
| Ge | 5.659Å | −5.99 | −4.42 | −0.78 | −8.02 |

MgO and SrTiO$_3$ have a sublattice structure similar to that of the semiconductor substrates 11, but have very different lattice constants. For MgO and SrTiO$_3$ the structural relationship between buffer layer 15 and substrate 13 can be described in terms of a pair of superlattices defined by the two materials. The substrate superlattice cell is composed of 3 cells of the substrate lattice. A substrate superlattice dimension can be defined as being equal to 3 times a sublattice constant of the substrate. Buffer layer 13 has a superlattice cell composed of four cells of the metal oxide buffer layer lattice. The buffer layer superlattice dimension is equal to 4 times the oxygen-to-oxygen lattice spacing of buffer layer 13. The percentage difference between substrate and buffer layer superlattice dimensions is referred to herein as superlattice mismatch. Mismatches of (100) oriented MgO and SrTiO$_3$ to semiconductor substrates appear in Table 5 and similar values can be calculated for (111) oriented MgO and SrTiO$_3$ using information in Tables 2 and 4.

A U.S. patent application entitled: "A MULTILAYER STRUCTURE HAVING A (111)-ORIENTED BUFFER LAYER" filed by Hung L. S., et al, concurrently with this application discloses multilayer structures having a semiconductor substrate and a buffer layer of a metal oxide, such as (111)MgO, which has a three-fold rotation symmetry about the substrate [111] direction. The structures of that application could be used as base 11 of the multilayer structures 10 of the invention.

Electrode 17 consists of one or more epitaxial metal layers. Suitable metals are those which are capable of forming a 4:3 superlattice with a BaF$_2$, Ca$_x$Sr$_{1-x}$F$_2$, CeO$_2$, or ZrO$_2$ buffer layer 15, or a 1:1 superlattice with an MgO or SrTiO$_3$ buffer layer 15. Examples of such metals are Pd, Pt, Au, Ag, CoPt$_3$, AuPt$_3$, Ag$_3$Pt, and Au$_3$Pt. A relatively high melting point and a good resistance to oxidation are desirable and these characteristics are listed for some elemental metals in Table 6. Al is capable of forming the required superlattice, but is undesirable because of its low resistance to oxidation. Tables 7 and 8 list the (100) lattice mismatch of elemental metals and metal alloys, respectively, to underlying buffer layers. Table 9 lists (111) sublattice constants for the metals and metal alloys, from which comparable mismatch values could also be calculated.

TABLE 6

| Metal | Resistance to oxidation | Melting point in °C. |
|---|---|---|
| Pt | excellent | 1772 |
| Pd | fine | 1552 |
| Au | good | 1064 |
| Ag | good | 961 |

TABLE 7

| Metal electrode | | Mismatch of metal electrode to buffer layer | | | |
|---|---|---|---|---|---|
| | | Pd | Pt | Au | Ag |
| Buffer layer (super-lattice ratio) | (100) Sub-lattice constants | 3.890Å | 3.923Å | 4.078Å | 4.086Å |
| CaF$_2$ (3:4) | 5.463Å | −5.06 | −4.25 | −0.47 | −0.27 |
| SrF$_2$ (3:4) | 5.800Å | −10.57 | −9.82 | −6.25 | −6.07 |
| BaF$_2$ (3:4) | 6.200Å | −16.34 | −15.63 | −12.30 | −12.13 |
| ZrO$_2$ | 5.320Å | −2.51 | −1.68 | +2.21 | +2.41 |

TABLE 7-continued

| Metal electrode | Mismatch of metal electrode to buffer layer | | | |
|---|---|---|---|---|
| | Pd | Pt | Au | Ag |
| (3:4) | | | | |
| CeO$_2$ 5.409Å | −4.11 | −3.30 | +0.52 | +0.72 |
| (3:4) | | | | |
| MgO 4.211Å | −7.62 | −6.84 | −3.16 | −2.97 |
| (1:1) | | | | |
| SrTiO$_3$ 3.904Å | −0.36 | +0.49 | +4.46 | +4.66 |
| (1:1) | | | | |

TABLE 8

| Metal electrode | Mismatch of metal electrode to buffer layer | | | |
|---|---|---|---|---|
| | CoPt$_3$ | AgPt$_3$ | Ag$_3$Pt | AuPt$_3$ |
| Buffer layer (super-lattice ratio) | (100)Sub-lattice constants 3.831Å | 3.885Å | 3.887Å | 3.926Å |
| CaF$_2$ 5.463Å (3:4) | −6.50 | −5.18 | −5.13 | −4.18 |
| SrF$_2$ 5.800Å (3:4) | −11.93 | −10.69 | −10.64 | −9.75 |
| BaF$_2$ 6.200Å (3:4) | −17.61 | −16.45 | −16.41 | −15.57 |
| ZrO$_2$ 5.320Å (3:4) | −3.98 | −2.63 | −2.58 | −1.6 |
| CeO$_2$ 5.409Å (3:4) | −5.56 | −4.23 | −4.18 | −3.22 |
| MgO 4.211Å (1:1) | −9.02 | −7.74 | −7.69 | −6.76 |
| SrTiO$_3$ 3.904Å (1:1) | −1.87 | −0.49 | −0.44 | +0.56 |

TABLE 9

| Material | (111) Sublattice constant (in Angstroms) |
|---|---|
| Pd | 2.750 |
| Pt | 2.774 |
| Au | 2.884 |
| Ag | 2.889 |
| CoPt$_3$ | 2.709 |
| AgPt$_3$ | 2.747 |
| Ag$_3$Pt | 2.748 |
| Au$_3$Pt | 2.776 |

In a preferred embodiment of the invention electrode has first and second electrode layers 19, 21. First electrode layer 19 of electrode 17 is an epitaxial layer of Pd. Pd is not a desirable material for a single layer electrode 17, because Pd is readily oxidized upon heat treatment in oxygen. The Pd first electrode layer 19 can be deposited by electron beam, laser ablation or sputtering deposition techniques. In the embodiment of Example 1, Pd was deposited on a buffer layer of (100)CaF$_2$ at 500° C. and showed epitaxial growth in the <100> direction and good adhesion to the CaF$_2$. In that embodiment of the invention, first electrode layer is Pd and second electrode layer is Pt. Pt has high resistance to oxidation, but does not adhere well to metal oxides and alkaline earth metal fluorides. In that embodiment of the invention, it is desirable to use a thin layer of Pd, so as to minimize the area of the exposed Pd edge. A suitable thickness of the Pd first electrode layer 19 is from 2 to 60 nm. A suitable thickness for the Pt second electrode layer is from 10 to 300 nm.

Upper layer 23 is an oriented epitaxial film which has a crystal structure that is compatible with the epitaxial electrode. Suitable materials for upper layer 23 include: dielectric materials such as SrTiO$_3$, ferroelectric materials such as BaTiO$_3$, PbTiO$_3$, KNbO$_3$, and PbLa$_x$Zr$_y$Ti$_{1-(x+y)}$O$_3$), where x+y is from 0 to 1 nonlinear optical materials such as KNbO$_3$, and electro-optical materials such as BaTiO$_3$, KTa$_{0.35}$Nb$_{0.65}$O$_3$, and Ba$_{0.25}$Sr$_{0.75}$Nb$_2$O$_6$. Upper layer 23 has a cubic, tetragonal, or orthorhombic structure and a lattice mismatch to the metal electrode of 15 percent or less. Table 10 lists (100) mismatches for some examples of materials suitable for upper layer 23. Upper layer 23 can be prepared by a variety of techniques such as sputtering, laser ablation and metal organic chemical vapor deposition.

TABLE 10

| | | Mismatch of oxide upper layer to metal electrode | | | | |
|---|---|---|---|---|---|---|
| | | PbTiO$_3$ | KNbO$_3$ | BaTiO$_3$ | PZT | KTa$_n$Nb$_m$O$_3$ n = 0.35 m = 0.65 |
| | (100) Sub-lattice constants | 3.896Å | 3.971Å | 3.989Å | 4.04Å | 3.977Å |
| Metal | | | | | | |
| Pt | 3.923Å | −0.69 | +1.22 | +1.68 | +2.98 | +1.38 |
| Au | 4.078Å | −4.46 | −2.62 | −2.18 | −0.93 | −2.48 |
| Ag | 4.086Å | −4.65 | −2.81 | −2.37 | −1.13 | −2.67 |
| CoPt$_3$ | 3.831Å | +1.70 | +3.65 | +4.12 | +5.45 | +3.81 |
| AgPt$_3$ | 3.885Å | +0.28 | +2.21 | +2.68 | +3.99 | +2.37 |
| Ag$_3$Pt$_3$ | 3.887Å | +0.23 | +2.16 | +2.62 | +3.93 | +2.32 |
| Au$_3$Pt | 3.926Å | −0.76 | +1.15 | +1.60 | +2.90 | +1.30 |

The following examples are presented for a further understanding of the invention.

EXAMPLE 1

Four inch (100)Si wafers were used as substrates. The wafers were sequentially etched in H$_2$SO$_4$:H$_2$O$_2$:H$_2$O; NH$_4$OH:H$_2$O$_2$:H$_2$O; diluted HF and HNO$_3$:H$_2$O$_2$:H$_2$O solutions. After a rinse in deionized water, the wafers were blown dry in N$_2$. Prior to being loaded in an evaporator the wafers were subjected to a spin-etch or dip-etch process in an ARA:H$_2$O:HF=9:0.5:0.5 solution, where ARA is 90% ethanol and 5% each of methanol and isopropyl alcohol.

CaF$_2$ buffer layers were deposited on the substrates in an electron-beam evaporator with pressures of $1 \times 10^{-9}$ Torr prior to deposition, rising to a maximum of $1-2 \times 10^{-7}$ Torr during deposition. No additional thermal etching was used before heating the substrates to a desired temperature for fluoride growth. The substrate was heated by a radiative heater consisting of tantalum wires. The growth temperature varied between 400°-600° C. and was monitored by an infrared pyrometer using published emissivity values. The deposition rate was 0.2-0.3 nm.sec$^{-1}$ and the thickness of the fluoride films was about 100-300 nm.

In this Example and the other examples and comparative experiments, X-ray diffraction was used to determine the microscopic structure of the deposited thin films, and different techniques were employed to yield complete information. These techniques are well known and are illustrated by B. D. Cullity, Elements of x-ray Diffraction (Addison-Wesley, Reading, Mass.). In theta-2-theta x-ray diffraction, only lattice planes parallel to the substrate surface are detected; this means for single-crystalline films that strong lines will only be detected if a major crystallographic direction is aligned with the substrate surface. Rocking curves are measured with a stationary detector positioned at an appropriate diffraction angle 2-theta by tilting the sample through a suitable angle range. Such curves deliver the distribution of the crystal orientation with respect to the substrate surface normal. The feature of in-plane orientation was examined by x-ray pole figure measurements. In x-ray pole figure analysis, a beam of monochromatic x-radiation is diffracted from a thin film, and the sample is tilted to such a degree that a selected set of parallel crystallographic planes meet the Bragg condition. The film is then rotated about an axis normal to the substrate. Reflected diffraction over a wide range of rotation angles (referred to as azimuth angles) indicates a distribution of in-plane orientations. For such materials as (100)-oriented single crystalline Pt or c-oriented single crystalline KNbO$_3$, ideal alignment is seen as four spot reflections separated one from the other by a 90° rotation angle. A poor in-plane alignment indicates a large number of individual microcrystalline film segments (referred to as grains) separated by high angle intergrain boundaries.

Both ion channeling and x-ray diffraction techniques were conducted and indicated a high degree of epitaxy of the fluoride buffer layers. The CaF$_2$ buffer layers on (100)Si exhibited a minimum channeling yield of 5.6%

A 6 nm thick Pd first electrode layer was deposited on the CaF$_2$ buffer layer and a 60 nm thick Pt second electrode layer was deposited over the Pd layer. Both metal layers were deposited at 500° C. by electron beam deposition following the CaF$_2$ deposition without beaking vacuum. The Pt second electrode layer was highly conductive with a sheet resistivity of about $1 \times 10^{-5}$ ohm-cm.

Figure 2:
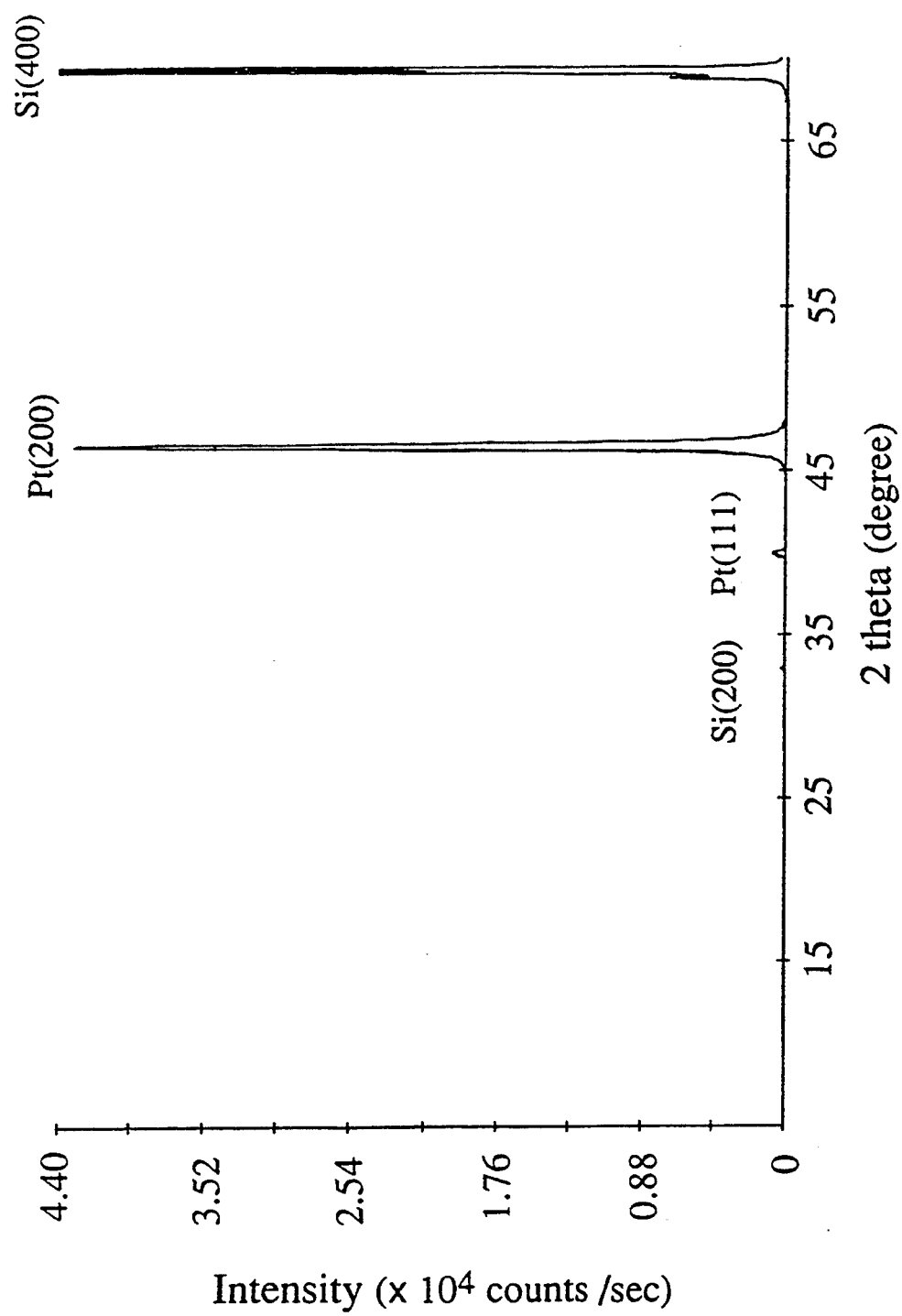
FIG. 2. An x-ray diffraction pattern of the multilayer structure of Example 1, which did not have an upper layer of metal oxide.
Figures 3A, 3B:
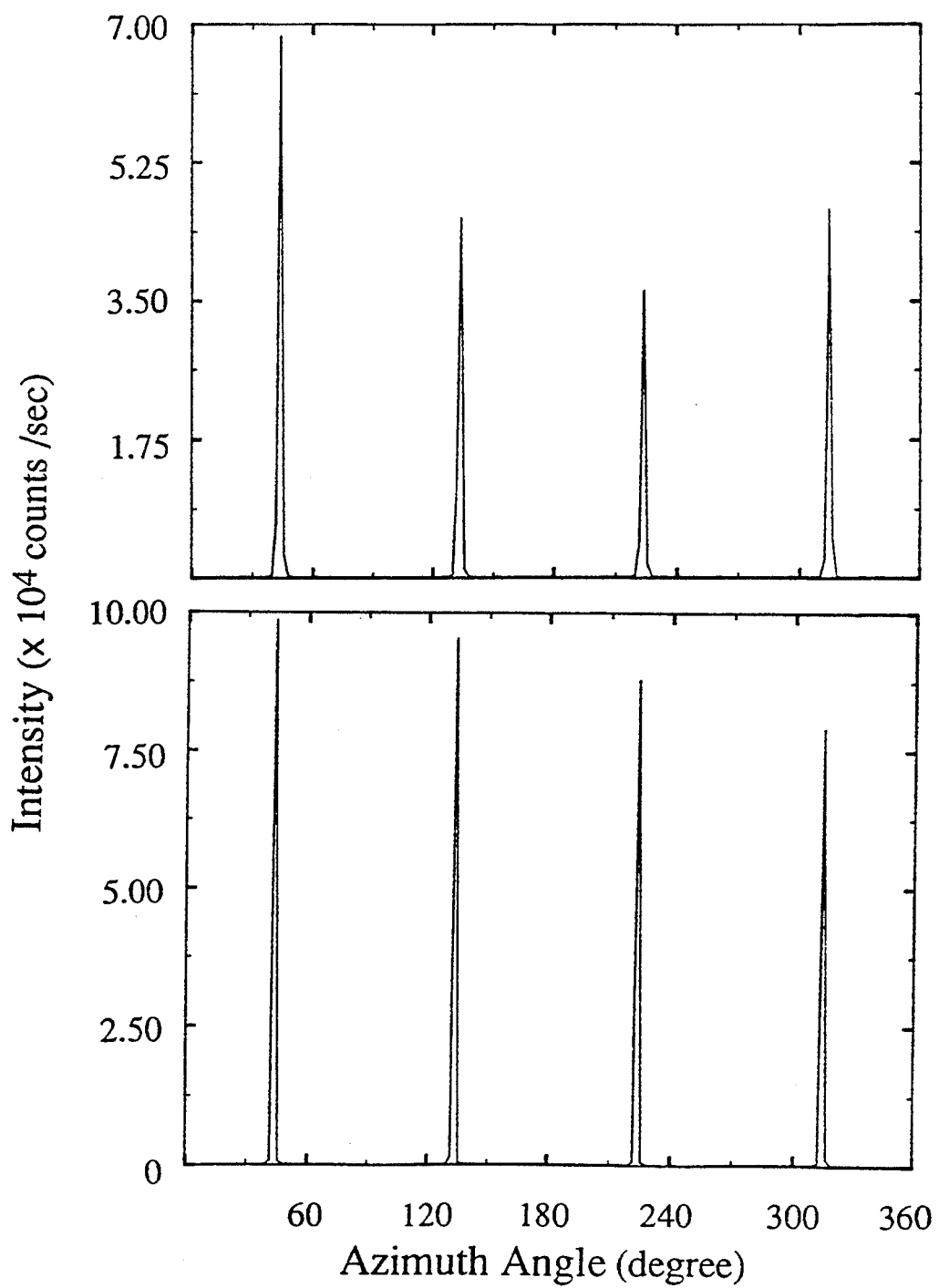
FIG. 3a. An x-ray pole figure of the multilayer structure of Example 1, for the (220) reflection of the Pt layer.
FIG. 3b. An x-ray pole figure of the multilayer structure of Example 1, for the (220) reflection of (100)Si substrate.

X-ray diffraction analysis indicated that the deposited Pt layer was stable against oxidation, since the x-ray diffraction peaks from Pt retained their original intensity and the resistivity remained unchanged after a 30 minute anneal at 650° C. in air. The x-ray diffraction pattern in FIG. 2 of the (100)Si/CaF$_2$/Pd/Pt multilayer structure showed that the layers were highly oriented with an intensity ratio of Pt(200) to Pt(111) being 50:1. X-ray rocking curve analysis indicated that the full width at half-maximum (FWHM) of the (200) line was about 0.81°. Crystal orientation on the (100) plane was examined by x-ray diffraction at tilted planes. FIG. 3(a) shows an angular scan for the (220) lines of Pt when the sample was rotated around an axis parallel to its surface normal Peaks were found every 90° suggesting a single crystalline film. The narrow width of the peaks at half intensity of the angular scan indicated good epitaxial quality of the Pt layer. By comparing the angular scans obtained from the Pt layer in FIG. 3(a) and from the underlying Si substrate in FIG. 3(b), it was found that the in-plane epitaxial relationship was Pt[220]//Si[220]. A pull test using an adhesive tape revealed good adhesion of the Pt to the underlying substrate.

It is known that Pt reacts with Si at temperatures above 150°–200° C., the growth of epitaxial Pt upon Si at elevated temperature indicates the effectiveness of the CaF$_2$ layer acting as a diffusion barrier to impede Pt-Si reaction. Since the mismatch between Pt, for which a=0.3923 nm, and CaF$_2$, for which a=0.5463, is quite large, it could have been predicted that the Pt lattice might be rotated by 45 degrees about the [100] surface normal with respect to the CaF$_2$ lattice, resulting in a small mismatch of 1.6%; however, the in plane alignment for the Pt film matched that of the CaF$_2$ layer, indicating a superlattice match.

EXAMPLE 2

A (100)Si/(100)CaF$_2$/(100)Pd/(100)Pt multilayer structure was first prepared as in Example 1.

A zirconium precursor solution was made by refluxing a toluene solution of 1 part of zirconium n-propoxide (Alfa Chemicals) and 2 parts of neodecanoic acid, under Ar for 4.5 hours. Solvent was then removed by rotary evaporation resulting in a viscous liquid with a Zr content of 17.91 percent. One gram of rosin was dissolved in 2.6 grams of toluene and 1.64 grams of butyl alcohol upon heating. Then, 4.4 grams of said viscous liquid was added and gently heated for 15 minutes, cooled to room temperature and filtered with a 0.65 micron nylon membrane filter. The Zr content of the resulting precursor was determined by TGA to be 9.87% by weight.

The titanium precursor was prepared by mixing Ti butoxide and excess 2-ethylhexanoic acid. The mixture was filtered, and the Ti content was determined by TGA to be 5.37% by weight.

The PZT precursor was prepared as follows. 4.62 grams of the Zr precursor was mixed with 4.02 grams of the Ti precursor and 7.03 grams of lead resinate to produce a precursor with a composition of Pb(Zr$_{0.53}$Ti$_{0.47}$). The lead resinate is available commercially from Engethard with a Pb content of 27.8% by weight. The mixture was heated to the boiling point, and 1.56 grams of 2-ethylhexanoic acid and 1.52 grams of rosin were added. The mixture was heated to dissolve all the rosin and was then filtered. The ratio of Pb:Zr:Ti was approximately 1:0.53:0.47 in the final precursor solution.

The PZT precursor was spin-coated at 4000 RPM for 30 sec on the multilayer structure. The precursor film was heated on a hot plate up to 450° C. and then thermally processed in a tube furnace at 635° C. for 30 min in 10% O$_2$/N$_2$.

X-ray diffraction analysis of the PZT upper layers showed the dominance of the (100) and (200) reflections. The ratio of the x-ray intensity of the (100) peak to that of the (110) peak is about 5:1, indicating a highly oriented PZT film because the ratio for the powder PZT is about 0.05:1. The presence of the (110) line of the PZT phase was found to be associated with the existence of the minor (111) oriented Pt.

EXAMPLE 3

The same procedures were followed as in Example 2, with the exception that a KNbO$_3$ upper layer was grown on the Pt electrode surface by pulsed laser ablation. A laser pulse energy of 360 mJ with a 30 ns duration and a pulse rate of 4 Hz was generated by a KrF eximer laser. The beam was focused to a 5 mm$^2$ spot onto a target containing polycrystalline KNbO$_3$. The (100)Si/(100)CaF/(100)Pd/(100)Pt multilayer structure was located 6 cm from the target and heated to 600°–700° C. by a resistive heater. The temperature was monitored by a thermocouple attached to an inner wall of the heater block. The deposition was carried out at a rate of 0.1 nm/pulse under an oxygen pressure of 106 m Torr. After 3000 pulses, the sample was cooled to room temperature with oxygen flowing at a pressure of 150 Torr.

Figure 5:
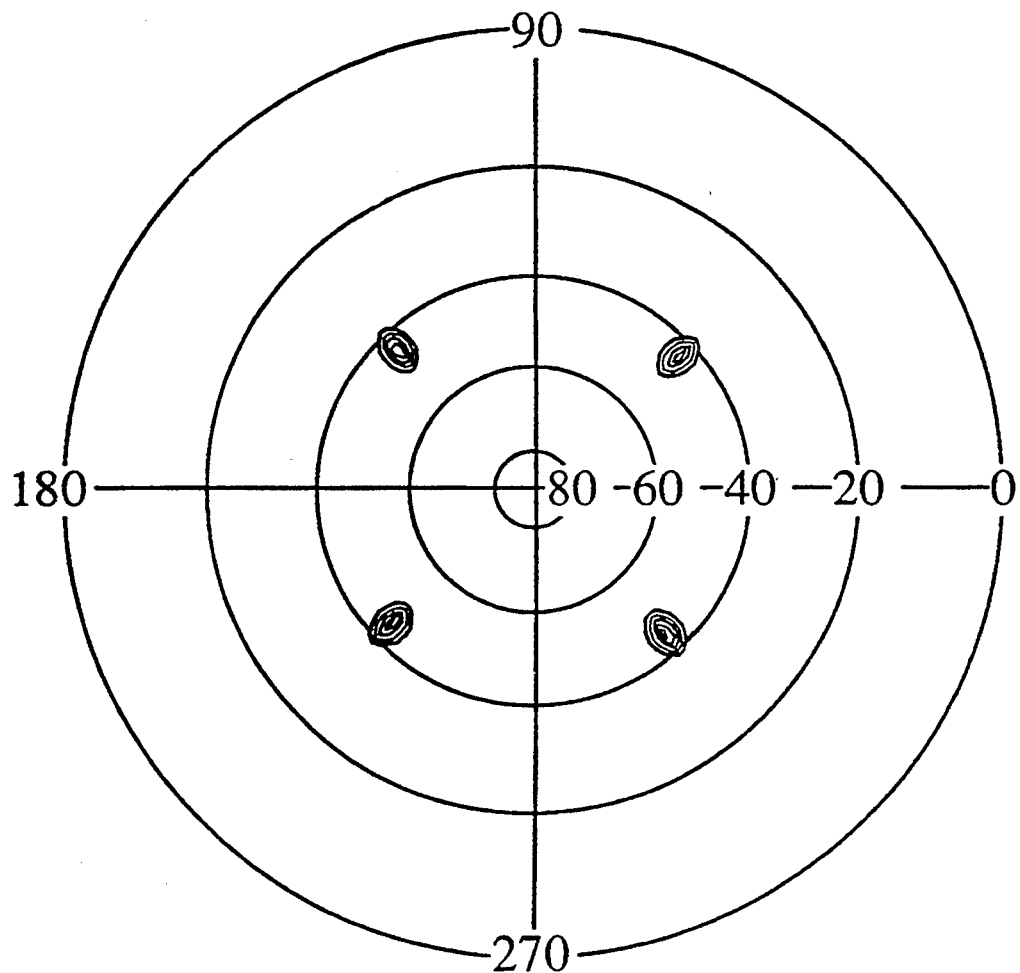
FIG. 5. An x-ray pole figure of the multilayer structure of Example 3 for the (111)peak of the KNbO$_3$ upper layer.

An x-ray diffraction pattern taken from the laser ablated KNbO$_3$ film grown on the multilayer structure showed only (001) and (002) reflections from KNbO$_3$. FIG. 5 is a pole figure of the reflection from the (111)

plane of the KNbO$_3$ upper layer. FIG. 5 shows four pole densities separated one from the other by a 90° rotation angle. These results clearly indicate an epitaxial KNbO$_3$ film grown of (100)Si with an underlying Pt layer.

EXAMPLE 4

The procedures of Example 1 were followed with the exception that instead of the Pd-Pt electrode, a 60 nm-thick Pd electrode was deposited on the epitaxial CaF$_2$ buffer layer at 500° C. without breaking the vacuum. The deposited Pd film exhibited a smooth surface and good adhesion to the CaF$_2$ buffer layer.

X-ray analysis revealed the dominance of the (200) reflection and electrical measurements showed a low sheet resistivity. However, both the intensity of the (200) reflection and the electrical conductivity were substantially dropped after anneals at 635° C. for 30 minutes in 10% O$_2$/N$_2$. The degradation of Pd is associated with the formation of Pd-oxides upon annealing. The PZT films grown on the (100)Si/CaF$_2$/Pd multilayer structure exhibited a randomly oriented polycrystalline structure. The formation of randomly oriented PZT films is attributed to Pd oxidation before PZT crystallization.

To further illustrate the significance of the invention, the following Comparative Experiments are provided. Comparative Experiments 1-6 illustrate the importance of a buffer layer between a substrate and a metal oxide upper layer. Comparative Experiments 7-10 indicate the importance of a single crystal buffer layer between a substrate and a metal electrode and the effect of use of a polycrystalline electrode on a superimposed metal oxide upper layer.

COMPARATIVE EXPERIMENT 1

A zirconium precursor solution was made by refluxing a toluene solution of 1 part of zirconium n-propoxide (Alfa Chemicals) and 2 parts of neodecanoic acid, under Ar for 4.5 hours. Solvent was then removed by rotary evaporation resulting in a viscous liquid with a Zr content of 17.91 percent. One gram of rosin was dissolved in 2.6 grams of toluene and 1.64 grams of butyl alcohol upon heating. Then, 4.4 grams of said viscous liquid was added and gently heated for 15 minutes, cooled to room temperature and filtered with a 0.65 micron nylon membrane filter. The Zr content of the resulting precursor was determined by TGA to be 9.87% by weight.

The titanium precursor was prepared by mixing Ti butoxide and excess 2-ethylhexanoic acid. The mixture was filtered, and the Ti content was determined by TGA to be 5.37% by weight.

The PZT precursor was prepared as follows. 4.62 grams of the Zr precursor was mixed with 4.02 grams of the Ti precursor and 7.03 grams of lead resinate to produce a precursor with a composition of Pb(Zr$_{0.53}$Ti$_{0.47}$). The lead resinate is available commercially from Engethard with a Pb content of 27.8% by weight. The mixture was heated to the boiling point, and 1.56 grams of 2-ethylhexanoic acid and 1.52 grams of rosin were added. The mixture was heated to dissolve all the rosin and was then filtered. The ratio of Pb:Zr:Ti was approximately 1:0.53:0.47 in the final precursor solution.

The PZT precursor was spin-coated at 4000 RPM for 30 sec on (100)Si. The precursor films were heated on a hot plate up to 450° C. and then thermally processed in a tube furnace at 635° C. for 30 min in 10% O$_2$/N$_2$. Interactions between Si and PZT took place during sintering. X-ray diffraction analysis indicated that the intensity of the reflection lines coming from the PZT phase was very weak and the film was randomly oriented.

COMPARATIVE EXPERIMENT 2

PZT precursor was prepared in the same manner as in Comparative experiment 1 and was spin-coated at 4000 RPM for 30 sec on (100)Si using an epitaxial CaF$_2$ layer as a buffer. The precursor films were heated on a hot plate up to 450° C. and then thermally processed in a tube furnace at 635° C. for 30 min in 10% O$_2$/N$_2$. X-ray diffraction analysis showed solely the existence of (100) and (200) reflections, indicating highly oriented PZT films.

COMPARATIVE EXPERIMENTS 3-4

(100)GaAs wafers were used as substrates. After a conventional cleaning in organic solvents, the wafers were etched in a solution with H$_2$SO$_4$:H$_2$O$_2$:H$_2$O = 1:8:500 for 30 seconds, followed by a deionized water rinse. Prior to being loaded in the evaporator, the samples were placed in a saturated (NH$_4$)$_2$S$_x$ solution for 3-5 minutes. Following this soak, the ammonium sulfide solution was diluted with deionized water and the samples were immersed in the diluted solution for 3-5 minutes before being dried under a stream of nitrogen.

The wafers were divided into two sets. One set of wafers did not receive a buffer layer. CaF$_2$ buffer layers were deposited on the other set of wafers in an electron-beam evaporator with pressures of $1 \times 10^{-9}$ Torr prior to deposition, rising to a maximum of $1-2 \times 10^{-7}$ Torr during deposition. No additional thermal etching was used before heating the substrates to a desired temperature for fluoride growth. The substrate was heated by a radiative heater consisting of tantalum wires. The growth temperature varied between 400°-600° C. and was monitored by an infrared pyrometer using published emissivity values. The deposition rate was 0.2-0.3 nm.sec$^{-1}$ and the thickness of the fluoride films was about 100-300 nm. The backside of the GaAs substrate was encapsulated with 100 nm of Si-nitride to suppress GaAs dissociation upon heating at elevated temperatures.

Figure 4:
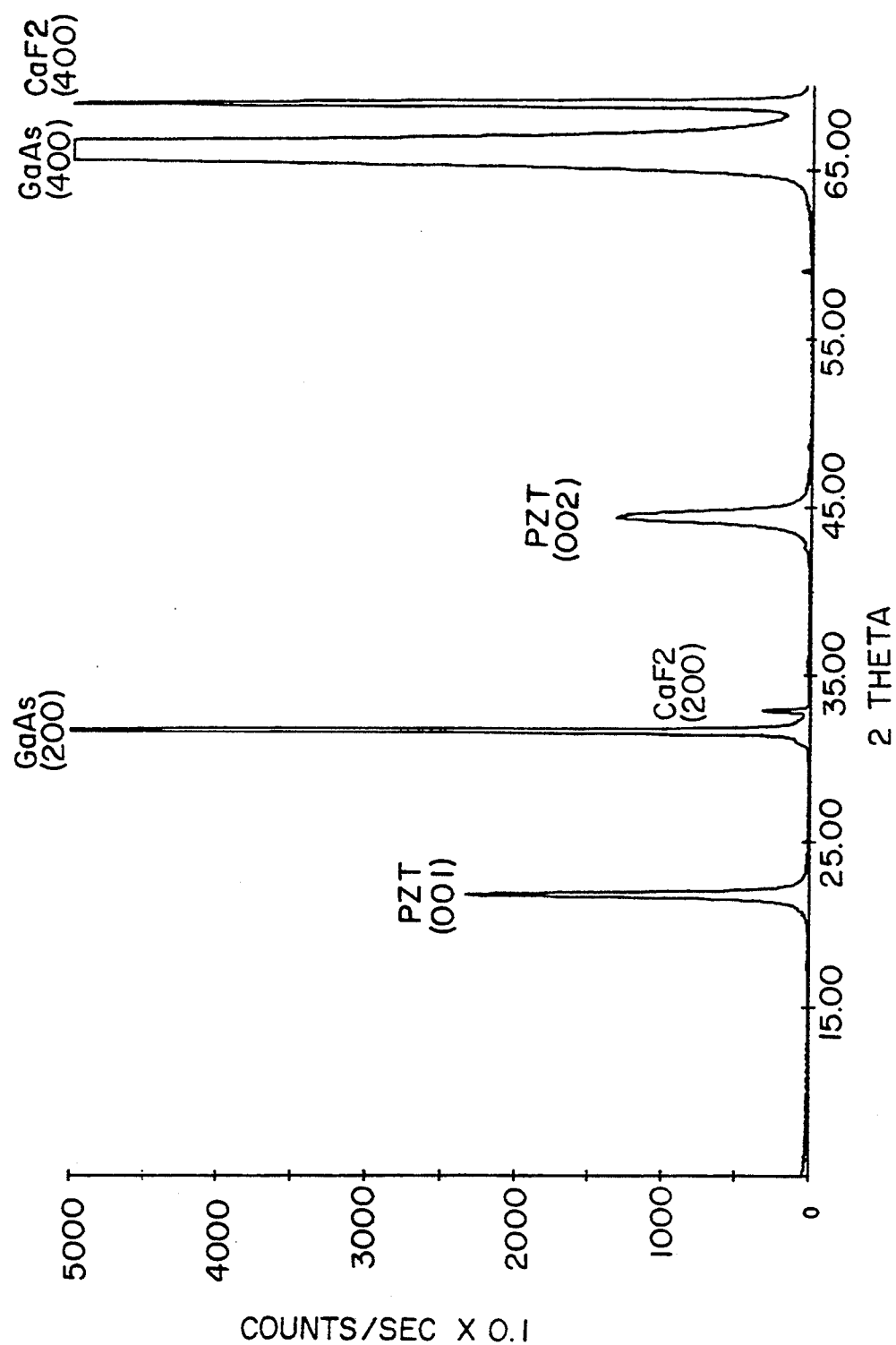
FIG. 4. An x-ray diffraction pattern of a PZT film grown on (100)GaAs/CaF$_2$ in Comparative Experiment 4.

PZT precursor was prepared and spin coated on both sets of wafers as in Comparative Experiment 2. The x-ray diffraction spectrum for wafers having a CaF$_2$ buffer layer, shown in FIG. 4, indicated solely the existence of (100) and (200) reflections, indicating highly oriented PZT films. In contrast, no PZT phase formation was observed for wafers lacking a buffer layer.

COMPARATIVE EXPERIMENTS 5-6

(100)Si wafer was coated with thermally grown SiO$_2$ or CVD-deposited Si$_3$N$_4$. PZT precursor was prepared and applied as in Comparative experiment 1. Interactions between Si and PZT were limited, but the PZT films exhibited a polycrystalline structure with the dominating (110) reflection.

COMPARATIVE EXPERIMENT 7

A (100)Si wafer coated with a Pt layer was used as a base. The base was prepared by spin coating platinum resinate with a Pt content of 12.0% on a Si substrate and subsequently heating the substrate up to 500° C. X-ray analysis indicated that the Pt was almost randomly oriented with no signs of its reaction with Si. The limited reaction between Pt and Si is attributed to the presence of an interfacial Si-oxide layer.

PZT precursor was prepared as in Comparative Experiment 1 and was spin-coated at 4000 RPM for 30 sec on the Pt-coated Si base. The precursor film was heated on a hot plate up to 450° C. and then thermally processed in a tube furnace at 635° C. for 30 minutes in 10% $O_2/N_2$. Interactions between Si and PZT were not observed, but the PZT films were randomly oriented due to the polycrystalline nature of the Pt layer.

COMPARATIVE EXPERIMENT 8

The same procedures were followed as in Comparative Example 7, with the exception that the Pt electrode was prepared by electron-beam evaporation on a clean Si wafer. Upon heating Si reacted with Pt to form PtSi and subsequently diffused across PtSi into the PZT overlayer.

COMPARATIVE EXPERIMENTS 9-10

The same procedures were followed as in Comparative Example 7, with the exception that the Pt was electron-beam evaporated on a $SiO_2$-covered (100)Si wafer or a Ti layer was first deposited followed by a Pt layer. The Pt film was neither oriented nor adhesive to the underlying substrate. The adhesion of Pt to $SiO_2$ was greatly improved by the deposit of the Ti intermediate layer, but the PZT films prepared on the Si/SiO$_2$/Ti/Pt structure were polycrystalline with a dominating (110) reflection.

The invention has been described in detail with particular reference to preferred embodiments thereof, but it will be understood that variations and modifications can be effected within the spirit and scope of the invention.

What is claimed is:

1. A multilayer structure comprising in order:
    an oriented single crystal semiconductor substrate;
    an epitaxial buffer layer, wherein said buffer layer has a 1 to 1 sublattice mismatch to said semiconductor substrate of less than 15 percent, and said buffer layer defines a buffer layer superlattice dimension equal to 3 times the sublattice spacing of said buffer layer;
    an epitaxial metal electrode, wherein said metal electrode defines an electrode superlattice dimension equal to 4 times a sublattice spacing of said metal electrode, said metal electrode superlattice dimension being within 15 percent of said buffer layer superlattice dimension; and
    an epitaxial metal oxide upper layer deposited on said metal electrode.

2. The multilayer structure of claim 1, wherein said substrate is doped or undoped and comprises at least one material selected from the group consisting of Si compound, Ge compounds, and compounds having (i) and (ii), wherein (i) is at least one element selected from the group consisting of Al, Ga and In and (ii) is at least one element selected from the group consisting of N, P, As, and Sb.

3. The multilayer structure of claim 1, wherein said semiconductor substrate has a (111) or (100) orientation.

4. The multilayer structure of claim 1, wherein said buffer layer comprises alkaline earth metal fluoride or metal oxide.

5. The multilayer structure of claim 4, wherein said buffer layer comprises a material selected from the group consisting of $BaF_2$ and $Ca_xSr_{1-x}F_2$, where x ranges from 0 to 1.

6. The multilayer structure of claim 4, wherein said buffer layer comprises a material selected from the group consisting of $CeO_2$ and $ZrO_2$.

7. The multilayer structure of claim 1, wherein said metal electrode comprises at least one material selected from the group consisting of Pd, Pt, Au, and Ag.

8. The multilayer structure of claim 7, wherein said metal electrode comprises a Pd electrode layer deposited on said buffer layer and a Pt electrode layer deposited on said Pd layer.

9. The multilayer structure of claim 1, wherein said metal electrode comprises a material selected from the group consisting of $CoPt_3$, $AuPt_3$, $Ag_3Pt$, and $Au_3Pt$.

10. The multilayer structure of claim 9, wherein said upper layer comprises a material selected from the group consisting of $SrTiO_3$, $BaTiO_3$, $PbTiO_3$, $KNbO_3$, $KTa_{0.35}Nb_{0.65}O_3$, $Ba_{0.25}Sr_{0.75}Nb_2O_6$, and $PbLa_xZr_yTi_{1-(x+y)}O_3$, where $x+y$ ranges from 0 to 1.

11. The multilayer structure of claim 1, wherein said single crystal semiconductor substrate has a zinc blend crystal structure.

12. The multilayer structure of claim 1, wherein said single crystal semiconductor substrate has a diamond crystal structure.

13. The multilayer structure of claim 1, wherein said semiconductor substrate comprises a compound selected from Group IVa.

14. The multilayer structure of claim 13, wherein said compound comprises Si.

15. The multilayer structure of claim 13, wherein said compound comprises Ge.

16. The multilayer structure of claim 1, wherein said semiconductor substrate comprises a compound having at least one element selected from Group IIIa and at least one element from Group Va.

17. A multilayer structure comprising in order:
    an oriented single crystal semiconductor substrate, wherein said substrate defines a substrate superlattice dimension equal to 3 times the sublattice spacing of said substrate;
    an epitaxial buffer layer, wherein said buffer layer defines a buffer layer superlattice dimension equal to 4 times a sublattice spacing of said buffer layer, said buffer layer superlattice dimension being within 15 percent of said substrate superlattice dimension;
    an epitaxial metal electrode, wherein said metal electrode has a 1 to 1 sublattice mismatch to said buffer layer of less than 15 percent; and
    an epitaxial metal oxide upper layer deposited on said metal electrode.

18. The multilayer structure of claim 17, wherein said substrate is doped or undoped and comprises at least one material selected from the group consisting of Si compound, Ge compounds, and compounds having (i) and (ii), wherein (i) is at least one element selected from the group consisting of Al, Ga and In and (ii) is at least one element selected from the group consisting of N, P, As, and Sb.

19. The multilayer structure of claim 17, wherein said semiconductor substrate has a (111) or (100) orientation.

20. The multilayer structure of claim 17, wherein said buffer layer comprises metal oxide.

21. The multilayer structure of claim 20, wherein said buffer layer comprises a material selected from the group consisting of MgO and SrTiO$_3$.

22. The multilayer structure of claim 17, wherein said metal electrode comprises at least one material selected from the group consisting of Pd, Pt, Au, and Ag.

23. The multilayer structure of claim 22, wherein said metal electrode comprises a Pd electrode layer deposited on said buffer layer and a Pt electrode layer deposited on said Pd layer.

24. The multilayer structure of claim 17, wherein said metal electrode comprises a material selected from the group consisting of CoPt$_3$, AuPt$_3$, Ag$_3$Pt, and Au$_3$Pt.

25. The multilayer structure of claim 17, wherein said upper layer comprises a material selected from the group consisting of SrTiO$_3$, BaTiO$_3$, PbTiO$_3$, KNbO$_3$, KTa$_{0.35}$Nb$_{0.65}$O$_3$, Ba$_{0.25}$Sr$_{0.75}$Nb$_2$O$_6$, and PbLa$_x$Zr$_y$Ti$_{1-(x+y)}$O$_3$, where x+y ranges from 0 to 1.

26. The multilayer structure of claim 17, wherein said single crystal semiconductor substrate has a zinc blend crystal structure.

27. The multilayer structure of claim 17, wherein said single crystal semiconductor substrate has a diamond crystal structure.

28. The multilayer structure of claim 17, wherein said semiconductor substrate comprises a compound selected from Group IVa.

29. The multilayer structure of claim 28, wherein said compound comprises Si.

30. The multilayer structure of claim 28, wherein said compound comprises Ge.

31. The multilayer structure of claim 17, wherein said semiconductor substrate comprises a compound having at least one element selected from Group IIIa and at least one element from Group Va.

* * * * *